(12) United States Patent
Lee et al.

(10) Patent No.: US 9,054,057 B2
(45) Date of Patent: Jun. 9, 2015

(54) ORGANIC LIGHT-EMITTING DISPLAY DEVICE AND METHOD OF PREPARING THE SAME

(71) Applicant: Samsung Display Co., Ltd., Yongin, Gyeonggi-Do (KR)

(72) Inventors: Il-Sang Lee, Yongin-si (KR);
Sang-Wook Sin, Yongin-si (KR);
Sun-Young Jung, Yongin-si (KR);
Jin-Woo Park, Yongin-si (KR);
Dong-Jin Kim, Yongin-si (KR)

(73) Assignee: SAMSUNG DISPLAY CO., LTD., Yogin, Gyeonggi-Do (KR)

( * ) Notice: Subject to any disclaimer, the term of this patent is extended or adjusted under 35 U.S.C. 154(b) by 0 days.

(21) Appl. No.: 13/957,152

(22) Filed: Aug. 1, 2013

(65) Prior Publication Data
US 2014/0306188 A1    Oct. 16, 2014

(30) Foreign Application Priority Data
Apr. 15, 2013    (KR) .................. 10-2013-0041257

(51) Int. Cl.
| | | |
|---|---|---|
| H01L 29/08 | (2006.01) | |
| H01L 35/24 | (2006.01) | |
| H01L 51/00 | (2006.01) | |
| H01L 27/32 | (2006.01) | |
| H01L 51/52 | (2006.01) | |
| H01L 51/56 | (2006.01) | |

(52) U.S. Cl.
CPC ........ *H01L 27/3244* (2013.01); *H01L 51/5253* (2013.01); *H01L 2251/556* (2013.01); *H01L 51/56* (2013.01)

(58) Field of Classification Search
CPC ........................................ H01L 51/00
USPC ............. 257/40, E51.018, 100, E33.059, 79, 257/642; 313/512; 438/26
See application file for complete search history.

(56) References Cited

U.S. PATENT DOCUMENTS

| | | | |
|---|---|---|---|
| 4,314,031 A | 2/1982 | Sanford et al. | |
| 7,507,616 B2 * | 3/2009 | Seo et al. ........ | 438/158 |
| 7,915,823 B2 * | 3/2011 | Hayashi ........ | 313/512 |
| 8,389,983 B2 * | 3/2013 | Seo et al. ........ | 257/40 |
| 8,754,434 B1 * | 6/2014 | Gollier et al. ........ | 257/98 |
| 2006/0100299 A1 * | 5/2006 | Malik et al. ........ | 522/31 |
| 2007/0040501 A1 | 2/2007 | Aitken et al. | |
| 2007/0252526 A1 | 11/2007 | Aitken et al. | |

(Continued)

FOREIGN PATENT DOCUMENTS

KR    10-2008-0080019    9/2008

OTHER PUBLICATIONS

Extended European Search Report issued Jul. 15, 2014 in EP 13185677.5-1555.

*Primary Examiner* — Telly Green
(74) *Attorney, Agent, or Firm* — Knobbe, Martens, Olson & Bear LLP

(57) ABSTRACT

An organic light-emitting display device is disclosed. The organic light-emitting display device may include a substrate, an organic light-emitting portion provided on the substrate, a first inorganic film that seals and covers the organic light-emitting portion, and a second inorganic film provided on the first inorganic film and including a low temperature viscosity transition (LVT) inorganic material. A coefficient of thermal expansion (CTE) of the first inorganic film may be smaller than a CTE of the second inorganic film.

19 Claims, 5 Drawing Sheets

(56) References Cited

U.S. PATENT DOCUMENTS

| | | |
|---|---|---|
| 2008/0149924 A1 | 6/2008 | Aitken et al. |
| 2008/0206589 A1* | 8/2008 | Aitken et al. ............... 428/639 |
| 2009/0051274 A1* | 2/2009 | Hayashi ...................... 313/504 |
| 2010/0295031 A1* | 11/2010 | Seo et al. ...................... 257/40 |
| 2011/0140164 A1* | 6/2011 | Seo et al. ................... 257/100 |
| 2012/0028011 A1 | 2/2012 | An et al. |
| 2012/0139821 A1* | 6/2012 | Kim et al. ..................... 345/76 |
| 2012/0235171 A1* | 9/2012 | Kim et al. ..................... 257/88 |
| 2012/0242221 A1* | 9/2012 | Kim et al. ................... 313/512 |
| 2013/0228754 A1* | 9/2013 | Park ............................... 257/40 |
| 2013/0229107 A1* | 9/2013 | Park ............................. 313/504 |
| 2013/0230664 A1* | 9/2013 | Park ............................. 427/523 |
| 2013/0230665 A1* | 9/2013 | Park ............................. 427/535 |
| 2014/0138634 A1* | 5/2014 | Lee et al. ....................... 257/40 |

* cited by examiner

US 9,054,057 B2

ORGANIC LIGHT-EMITTING DISPLAY DEVICE AND METHOD OF PREPARING THE SAME

INCORPORATION BY REFERENCE OF ANY PRIORITY APPLICATIONS

Any and all applications for which a foreign or domestic priority claim is identified in the Application Data Sheet as filed with the present application are hereby incorporated by reference under 37 CFR 1.57. This application claims the benefit of Korean Patent Application No. 10-2013-0041257, filed on Apr. 15, 2013, the disclosure of which is incorporated herein in its entirety by reference.

BACKGROUND

1. Field

The disclosure is directed to organic light-emitting display devices and methods of manufacturing the same, and more particularly to organic light-emitting display devices having improved sealing structures and methods of manufacturing the same.

2. Description of the Related Technology

An organic light-emitting display device includes an organic light-emitting device including a hole injection electrode, an electron injection electrode, and an organic emission layer formed between the hole injection electrode and the electron injection electrode. The organic light-emitting display device is a self-emitting display device that generates light when excitons formed from a combination of holes injected from the hole injection electrode and electrons injected from the electron injection electrode in the organic emission layer drop from an excited state to a ground state.

The organic light-emitting display device that is a self-emitting display device does not require a separate light source, and thus, may be operated at a low voltage and formed as a thin and lightweight structure, and is on the spotlight as a next generation display device due to high quality properties such as wide viewing angles, excellent contrast and quick response. The organic light-emitting device is very vulnerable to external environment, for example, oxygen and moisture, and thus, a sealing structure that seals the organic light-emitting device from the external environment is needed. However, development of a thin organic light-emitting device and/or a flexible organic light-emitting device is still required.

SUMMARY OF CERTAIN INVENTIVE ASPECTS

One or more embodiments of the present disclosure may include an organic light-emitting display device having excellent sealing property and a method of manufacturing the organic light-emitting display device. Additional aspects will be set forth in part in the figures and description which follows and, in part, will be apparent from the figures in combination with the description, or may be learned by practice of the presented embodiments.

In a first aspect, an organic light-emitting display device is provided. The device may include, for example, a substrate, an organic light-emitting portion on the substrate, a first inorganic film covering the organic light-emitting portion, and a second inorganic film on the first inorganic film and including a low temperature viscosity transition inorganic material.

In some embodiments, a coefficient of thermal expansion of the first inorganic film is smaller than a coefficient of thermal expansion of the second inorganic film. In some embodiments, the first inorganic film may include a low temperature viscosity transition inorganic material having a higher viscosity transition temperature than a viscosity transition temperature of the low temperature viscosity transition inorganic material included in the second inorganic film. In some embodiments, the first inorganic film may include a low temperature viscosity transition inorganic material and a dispersed inorganic material dispersed in the first inorganic film. In some embodiments, the dispersed inorganic material may be the same material as the low temperature viscosity transition inorganic material included in the second inorganic film. In some embodiments, the low temperature viscosity transition inorganic material may include a tin oxide. In some embodiments, the low temperature viscosity transition inorganic material may further include a tin oxide and may further include at least one material selected from among a phosphorus oxide, boron phosphate, stannous fluoride, a niobium oxide, and a tungsten oxide. In some embodiments, the low temperature viscosity transition inorganic material includes SnO and may further include at least one material selected from $P_2O_5$, $BPO_4$, $SnF_2$, NbO, and $WO_3$. In some embodiments, a viscosity transition temperature of the low temperature viscosity transition inorganic material included in the second inorganic film may be lower than a transition temperature of the organic light-emitting portion. In some embodiments, the first inorganic film includes a Sn—(P,B)—O—F-based low temperature viscosity transition inorganic material. In some embodiments, the second inorganic film may include a Sn—P—O—F-based low temperature viscosity transition inorganic material. In some embodiments, the first inorganic film is the Sn—P—O—F-based low temperature viscosity transition inorganic material, and a ratio of phosphorus (P) to boron (B) of the first inorganic film may be about 9:1 to about 7:3. In some embodiments, a coefficient of thermal expansion of the first inorganic film may be greater than or equal to the coefficient of thermal expansion of the substrate. In some embodiments, the second inorganic film may wrap top and sides of the first inorganic film. In some embodiments, the organic light-emitting device according to an embodiment of the present disclosure may further include a bottom organic layer on a bottom surface of the substrate. In some embodiments, the organic light-emitting device may further include a third inorganic film between the substrate and the organic light-emitting portion. In some embodiments, the organic light-emitting device may further include a protective layer on the organic light-emitting portion.

In another aspect, a method of manufacturing an organic light-emitting display device is provided. The method may include, for example, forming an organic light-emitting portion on a substrate, forming a first inorganic film covering the organic light-emitting portion, and forming a second inorganic film including a low temperature viscosity transition inorganic material on the first inorganic film.

In some embodiments, a coefficient of thermal expansion of the first inorganic film is greater than a coefficient of thermal expansion of the substrate, but smaller than a coefficient of thermal expansion of the second inorganic film. In some embodiments, the forming of the second inorganic film may include, for example, forming a preliminary second inorganic film by providing a low temperature viscosity transition inorganic material on the first inorganic film, and healing including a heat treatment of the preliminary second inorganic film at a temperature greater than or equal to a viscosity transition temperature of the low temperature viscosity transition inorganic material. In some embodiments, the viscosity transition temperature of the low temperature viscosity transition inorganic material may be smaller than a transition temperature of a material comprised in the organic light-emitting portion. In the annealing, the preliminary second inorganic film may be heat treated at a temperature lower than a transition temperature of a material comprised in the organic light-emitting portion. In some embodiments, the annealing may be performed under a vacuum atmosphere or an inert gas atmosphere. In the annealing, the preliminary second inorganic film may be fluidized to infiltrate into pores of the first inorganic film and fill the pores to form a dispersed inorganic material.

In a further aspect, an organic light-emitting display device is provided. The device may include, for example, a substrate, an organic light-emitting portion on the substrate, a first inorganic film covering the organic light-emitting portion and including a first low temperature viscosity transition inorganic material, a second inorganic film provided on the first inorganic film and including a second low viscosity transition inorganic material, and a dispersed inorganic material dispersed in the first inorganic film and including the second low viscosity transition inorganic material.

In some embodiments, a viscosity transition temperature of the second low viscosity transition inorganic material is lower than a viscosity transition temperature of the first low viscosity transition inorganic material. In some embodiments, a coefficient of thermal expansion of the first inorganic film may be greater than a coefficient of thermal expansion of the substrate and smaller than a coefficient of thermal expansion of the second inorganic film. In some embodiments, the first low viscosity transition inorganic material may be a Sn—(P,B)—O—F-based low viscosity transition inorganic material in which a ratio of phosphorus to boron is about 9:1 to about 7:3, and the second inorganic film may include a Sn—P—O—F-based low viscosity transition inorganic material. In some embodiments, a viscosity transition temperature of the second low viscosity transition inorganic material may be lower than a transition temperature of the organic light-emitting portion.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION OF CERTAIN INVENTIVE EMBODIMENTS

Figure 1A:
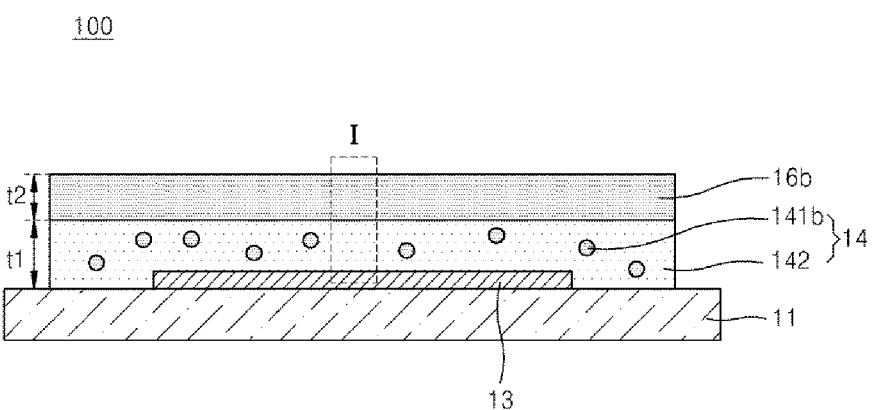
FIG. 1A a cross-sectional view schematically illustrating an organic light-emitting display device according to an embodiment of the present disclosure.

Reference will now be made in detail to embodiments, examples of which may be illustrated in the accompanying drawings. Like reference numerals refer to the like elements throughout and the descriptions of the like elements are not repeated. Also, a size of each component may be exaggerated for clarity and convenience of the description. Embodiments described below are for illustrative purposes only and thus, the present embodiments may have different forms and should not be construed as being limited to the descriptions set forth herein. For example, when a layer is described as provided on "the above", "upper portion", or "top" of a substrate or another layer, the layer may exist on another layer via a direct contact, or there may be another layer therebetween.

Also, the terms used in the specification are used only to describe the embodiments and are not used to limit the present disclosure. In the present application, a singular form also includes a plural form unless stated otherwise. The terms "includes" and/or "including" as used herein do not preclude the possibility of additional existence of components, processes, operations and/or devices. Terms such as the first and the second may be used to describe various components; however, the terms should not be construed to limit the components. The terms are only used for distinguishing a component from another component.

Figure 1B:
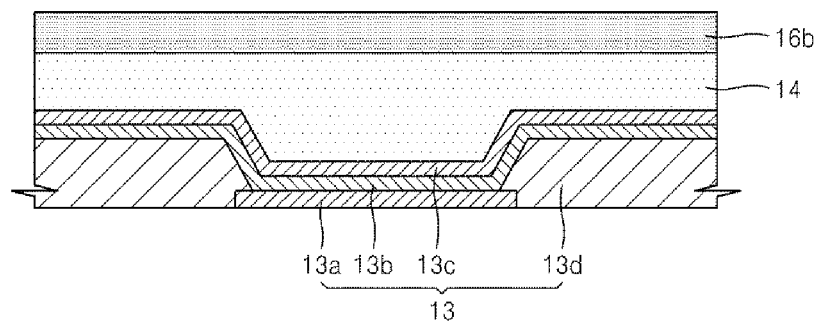
FIG. 1B illustrates an example of a partial cross-section of a portion I in FIG. 1A.

FIG. 1A schematically illustrates a cross-section of an organic light-emitting display device 100 according to an embodiment of the present disclosure and FIG. 1B illustrates an embodiment of a partial cross-section of I in FIG. 1A. Referring to FIGS. 1A and 1B, the organic light-emitting display device 100 according to an embodiment of the present disclosure includes a substrate 11, an organic light-emitting portion 13 formed on the substrate 11, a first inorganic film 14 covering the organic light-emitting portion 13 and a second inorganic film 16b provided on the first inorganic film 14. The second inorganic film 16b includes a low temperature viscosity transition (LVT) inorganic material. In the context of FIG. 1A and with respect to other embodiments disclosed herein, when a first element is described to "cover" a second element, the first element may entirely or partially overlap the second element. Thus, in some embodiments, the first element "covering" a second element will entirely overlap the second element. While in other embodiments, the first element covering a second element will only partially overlap the second element or will only overlap a portion of the second element.

The substrate 11 may be formed of a transparent glass material having $SiO_2$ as a main ingredient. But, the substrate 11 is not limited thereto and the substrate 11 may be formed of various materials such as ceramic, a transparent plastic material, a metal material or the like. On the other hand, when the organic light-emitting display device is a top emission type that emits light in the opposite direction of the substrate 11, the substrate 11 may be non-transparent and a substrate other than a glass substrate or a plastic substrate, such as a metal substrate or a carbon fiber substrate may be used. When an organic light-emitting display device is a flexible display device, the substrate 11 may be formed of a flexible substrate that is bendable and/or may be formed of a polyimide film.

The organic light-emitting portion 13 is formed on the substrate 11. The organic light-emitting portion 13 may have a sequentially laminated structure of a first electrode 13a, an organic emission layer 13b, a second electrode 13c on the substrate 11. The first electrode 13a and the second electrode 13c may each perform functions of an anode and a cathode, and may have polarities opposite to each other.

The first electrode 13a may be formed on the substrate 11 and edges of the first electrode 13a may be covered by a pixel defining layer 13d. When the first electrode 13a is an anode, a first electrode material may be selected from among materials having a high work function to facilitate hole injection.

The first electrode 13a may be a reflective electrode, a semi-transmissive electrode, or a transmissive electrode depending on the particular type of organic light-emitting display device. As the first electrode material, materials that are transparent and have excellent conductivity such as indium tin oxide (ITO), indium zinc oxide (IZO), tin oxide ($SnO_2$), zinc oxide (ZnO), $In_2O_3$, or the like may be used. When the first electrode 13a is provided as a reflective electrode, the first electrode 13a may include a reflective film formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent film formed of ITO, IZO, ZnO, or $In_2O_3$. In some embodiments, the first electrode 13a may have a single layer structure or a multi-layer structure having two or more layers. For example, the first electrode 13a may have a three-layered structure of ITO/Ag/ITO; but the structure is not limited thereto.

The organic emission layer 13b may be formed on the first electrode 13a and/or the pixel defining layer 13d. The organic emission layer 13b may be formed of a low molecular weight or a high molecular weight organic material. When the low molecular weight organic material is used, a hole injection layer (HIL, not shown), a hole transport layer (HTL, not shown), an electron transport layer (ETL, not shown), and/or an electron injection layer (EIL, not shown) may be laminated in a singular or a complex structure while having the organic emission layer 13b between the layers. Various organic materials may be used such as copper phthalocyanine (CuPc), N,N'-di(naphthalene-1-yl)-N,N'-diphenyl-benzidine (NPB), and tris-8-hydroxyquinoline aluminum ($Alq_3$). The low molecular weight organic materials may be formed by a vacuum deposition method using masks.

When the organic emission layer 13b is formed of a high molecular weight organic material, the HTL may be further included from the organic emission layer 13b to the anode, and here, PEDOT may be used for the HTL, and poly-phenylenevinylene (PPV)-based and polyfluorene-based high molecular weight organic materials may be used for the emission layer.

The organic emission layer 13b may include, for example, at least one of compounds 301, 311, and 321 (as illustrated in Formula 1, Formula 2 and Formula 3, respectively), such as the following:

Formula 1

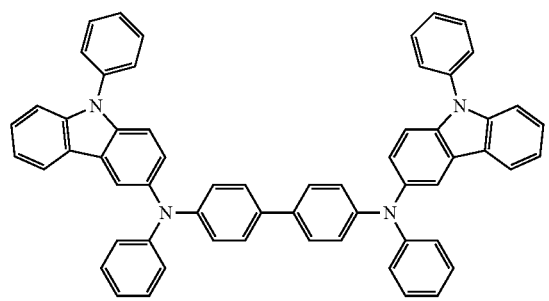

301

Formula 2

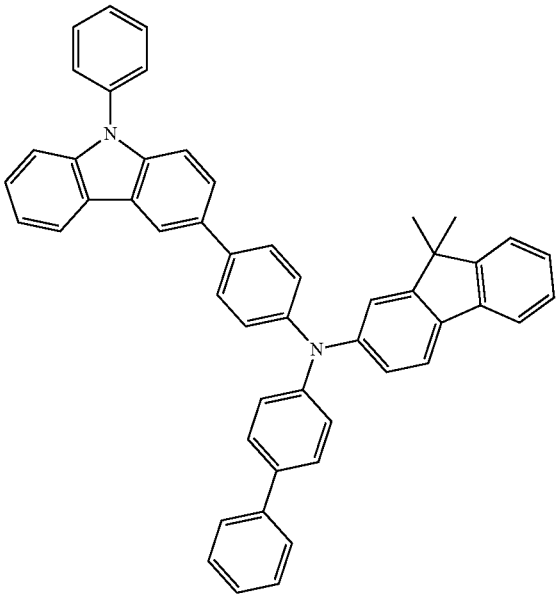

311

Formula 3

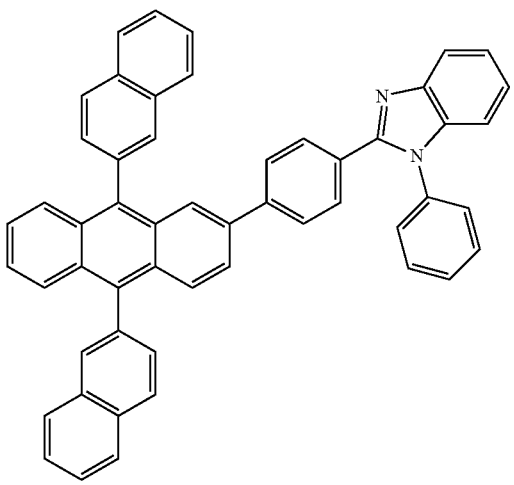

321

In some embodiments, the organic emission layers 13b each emitting red, green, and blue color light may be provided in a region defined by the pixel defining layer 13d to form a subpixel. Also, subpixels each emitting red, green, and blue color light may be used together to form a unit pixel. However, the organic emission layer 13b is not limited thereto and may be commonly provided on the entire light-emitting portion 13, regardless of the location of the pixel. Here, the organic emission layer 13b may be formed by, for example, vertically laminating or mixing layers including light-emitting materials emitting red, green, and blue color light. Provided that white light may be emitted, a combination of different colors is possible. Also, a color change layer that changes white light into a predetermined color light or a color filter may be further included in the organic light-emitting portion 13.

The second electrode 13c may be formed on the organic light-emitting layer 13b and may be electrically insulated from the organic light-emitting layer 13b. The second electrode 13c may be a cathode and here, a metal, an alloy, an electro-conductive compound, and a combination thereof having a low work function may be used as a second electrode-forming metal. For example, Lithium (Li), magnesium (Mg), aluminum (Al), aluminum-lithium (Al—Li), calcium (Ca), magnesium-indium (Mg—In), magnesium-silver (Mg—Ag), or the like may be formed as a thin film to obtain a reflective, a semi-transmissive, or a transmissive electrode. On the other hand, various changes are possible, such as forming a transmissive electrode by using ITO or IZO to obtain a top emission type device.

Although not shown in FIG. 1, the organic light-emitting portion 13 includes at least one pixel circuit in each pixel, and the pixel circuit may include at least one thin film transistor (not shown) and a capacitor (not shown). The first electrode 13a may be operated by electrically connecting to the thin film transistor. The first electrode 13a may be patterned in each pixel, and the second electrode 13c may be formed as a common electrode to cover all pixels. In the case of a bottom emission type structure, in which an image is displayed in a direction of the substrate 11, the second electrode 13c may be formed with a greater relative thickness to improve emission efficiency in the direction of the substrate 11. In the case of a top emission type structure, in which an image is displayed in a direction to the second electrode 13c, the second electrode 13c may be formed with a smaller relative thickness such that the second electrode 13c may be a semi-transmissive reflective film, or the second electrode 13c may be formed as a transparent conductor by using materials other than the materials described above. In this case, a reflective film may be further provided on the first electrode 13a.

A first inorganic film 14 and a second inorganic film 16b may prevent leakage of external moisture or oxygen into the organic light-emitting portion 13; hence, the first inorganic film 14 and the second inorganic film 16b may seal the organic light-emitting portion 13 to block the organic light-emitting portion 13 from external air.

In some embodiments, the first inorganic film 14 has a coefficient of thermal expansion (CTE) value smaller than a CTE value of the substrate 11 and/or the organic light-emitting portion 13 and the second inorganic film 16b.

The second inorganic film 16b includes a low temperature viscosity transition (LVT) inorganic material (hereinafter, referred to as a "LVT inorganic material"). The LVT inorganic material refers to an inorganic material having a low viscosity transition temperature. As used herein, "the viscosity transition temperature" does not refer to a temperature at which a viscosity of the LVT inorganic material completely changes from "solid" to "liquid", but to the lowest temperature at which fluidity may be provided to the LVT inorganic material.

In some embodiments as described below, the LVT inorganic material may be fluidized and then solidified, wherein a viscosity transition temperature of the LVT inorganic material may be lower than a transition temperature of a material included in the organic light-emitting portion 13.

The "transition temperature of a material included in the organic light-emitting portion 13" refers to a temperature that may cause a chemical and/or a physical change of a material included in the organic light-emitting portion 13. For example, the "transition temperature of a material included in the organic light-emitting portion 13" may refer to a glass transition temperature (Tg) of an organic material included in the organic emission layer 13b of the organic light-emitting portion 13. The glass transition temperature may be inferred from the results of thermal analyses (under $N_2$ atmosphere, a temperature range from about 600° C. (10° C./min)-TGA to about 400° C.-DSC, and pan type: Pt pan in a non-reusable aluminum pan (TGA) and a non-reusable aluminum pan (DSC)) by using a thermo gravimetric analysis (TGA) and a differential scanning calorimetry (DSC), and this is well known to one of ordinary skill in the art. For example, the transition temperature may be about 400, 420, 440, 460, 480, 500, 520, 540, 560, 580, 600° C. or any number in between.

The transition temperature of the material included in the organic light-emitting portion 13 may, for example, exceed 130° C.; however, the transition temperature is not limited thereto, and may be easily measured by a TGA analysis of the material included in the organic light-emitting portion 13 as described above.

In some embodiments, the transition temperature of the LVT inorganic material may be 80° C. or greater, for example, from about 80° C. to about 130° C.; however, the transition temperature is not limited thereto. For example, the transition temperature may be about 80, 90, 100, 110, 120, 130° C. or any number in between. The LVT inorganic material may be a mixture formed of one type of a compound or two or more types of compounds. The LVT inorganic material may include tin oxide (for example, SnO or $SnO_2$).

When the LVT inorganic material includes SnO, the content of the SnO may be about 20 wt % to about 100 wt %. In some embodiments, the content of the SnO may be about 20, 30, 40, 50, 60, 70, 80, 90 wt % or any value in between. For example, the LVT inorganic material may further include at least one type of phosphorous oxide (for example, $P_2O_5$), boron phosphate ($BPO_4$), tin fluoride (for example, $SnF_2$), niobium oxide (for example, NbO), and tungsten oxide (for example, $WO_3$), but the LVT inorganic material is not limited thereto.

For example, the LVT inorganic material may include:
SnO;
SnO and $P_2O_5$;
SnO and $BPO_4$;
SnO, $SnF_2$, and $P_2O_5$;
SnO, $SnF_2$, $P_2O_5$, and NbO; or
SnO, $SnF_2$, $P_2O_5$, and $WO_3$;
but, the LVT inorganic material is not limited thereto.

For example, the LVT inorganic material may have the following composition, but the composition is not limited thereto:
1) SnO (100 wt %);
2) SnO (80 wt %) and $P_2O_5$ (20 wt %);
3) SnO (90 wt %) and $BPO_4$ (10 wt %);
4) SnO (20-50 wt %), $SnF_2$ (30-60 wt %), and $P_2O_5$ (10-30 wt %) (here, a sum of weight percent of SnO, $SnF_2$ and $P_2O_5$ is 100 wt %);
5) SnO (20-50 wt %), $SnF_2$ (30-60 wt %), $P_2O_5$ (10-30 wt %) and NbO (1-5 wt %) (here, a sum of weight percent of SnO, $SnF_2$, $P_2O_5$, and NbO is 100 wt %); or
6) SnO(20-50 wt %), $SnF_2$ (30-60 wt %), $P_2O_5$ (10-30 wt %) and $WO_3$ (1-5 wt %) (here, a sum of weight percent of SnO, $SnF_2$, $P_2O_5$ and $WO_3$ is 100 wt %).

For example, the LVT inorganic material may include SnO (42.5 wt %), $SnF_2$ (40 wt %), $P_2O_5$ (15 wt %), and $WO_3$ (2.5 wt %), but the LVT inorganic material is not limited thereto.

When the second inorganic film 16b is formed with the above composition, the viscosity transition temperature of the second inorganic film 16b may be lower than the transition temperature of the organic light-emitting portion 13 to "heal" various defects that may form on the second inorganic film 16b during annealing of the second inorganic film 16b, which will be described later.

In some embodiments, the second inorganic film 16b may include a Sn—P—O—F-based LVT inorganic material.

Generally, the viscosity transition temperature of the LVT inorganic material may vary according to components and compositions of materials used to form the LVT inorganic materials, and the components and the compositions may be changed to adjust the viscosity transition temperature.

Also, a coefficient of thermal expansion of the LVT inorganic material may be as high as $(100~300)\times10^{-7}$/K, and it is known that the lower the viscosity transition temperature of the LVT inorganic material, the higher the coefficient of thermal expansion (CTE).

In some embodiments, CTE values of the substrate 11 and the organic light-emitting portion 13 are about $(30~70)\times10^{-7}$/K which are very different from the CTE value of the LVT inorganic material. The difference in the CTE values generates a difference in temperatures during a sealing process and may add stress to the substrate 11 and the organic light-emitting portion 13, thereby inducing a crack.

A first inorganic film 14 may have been introduced to control the stress caused by the difference in temperatures generated during the sealing process. A CTE value of the first inorganic film 14 is smaller than a CTE value of a second inorganic film 16b, and may be greater than or equal to the CTE value of the substrate 11 and/or the organic light-emitting portion 13. In some embodiments, the CTE of the first inorganic film 14 may be greater than or equal to the CTE value of the substrate 11 and smaller than CTEx2. In some embodiments, the CTE value of the first inorganic film 14 may be about $(70~100)\times10^{-7}$/K.

Any inorganic material satisfying the above CTE value may be used to form the first inorganic film 14. The first inorganic film 14 may include a porous inorganic material 142 in which pores 141a (see FIG. 2B) are formed. The pores 141a of the porous inorganic material may be filled with dispersed inorganic materials 141b. The dispersed inorganic materials 141b may be formed of the same materials as the second inorganic film 16b. The dispersed inorganic materials 141b may be formed when a portion of the second inorganic film 16b has been infiltrated during the annealing of the second inorganic film 16b. The first inorganic film 14 may become denser as the pores 141a are filled with the dispersed inorganic materials 141b. Accordingly, the first inorganic film 14 may have improved barrier property to external air including, for example, moisture and/or oxygen.

In some embodiments, the first inorganic film 14 may include a LVT inorganic material 142 having a different composition and/or component from the second inorganic film 16b. In some embodiments, the first inorganic film 14 may include a Sn—(P,B)—O—F-based LVT inorganic material 142. In this case, the Sn—(P,B)—O—F-based LVT inorganic material 142 may have been obtained by substituting phosphorus (P) of the Sn—P—O—F-based LVT inorganic material with boron (B). A substitution rate of B may be about 10% to about 30%. The greater the substitution rate of B, the smaller the CTE value of the Sn—(P,B)—O—F-based LVT inorganic material 142.

In some embodiments, the first inorganic film 14 includes the Sn—(P,B)—O—F-based LVT inorganic material 142, and the second inorganic film 16b may include the Sn—P—O—F-based LVT inorganic material. In some embodiments, the first inorganic film 14 may not be fluidized during the annealing for forming the second inorganic film 16b, which will be described later.

A thickness t1 of the first inorganic film 14 and a thickness t2 of the second inorganic film 16b may be about 1 µm to about 30 µm, for example, about 1 µm to about 5 µm. In some embodiments, the thickness t1 of the first inorganic film 14 is about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30 µm or any value in between. In some embodiments, the thickness t2 of the second inorganic film 16b is about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30 µm or any value in between. Here, when the thickness t1 of the first inorganic film 14 and the thickness t2 of the second inorganic film 16b satisfy the range of 1 µm to about 5 µm, a flexible organic light-emitting display device having a bendable property may be achieved.

Optical properties of the first inorganic film 14 and the second inorganic film 16b may differ from each other. Accordingly, the thickness t1 of the first inorganic film 14 and the thickness t2 of the second inorganic film 16b may be adjusted to change color and optical properties of the inorganic films 14, 16b. The first inorganic film 14 and the second inorganic film 16b may have a light transmission property.

Figure 2A:
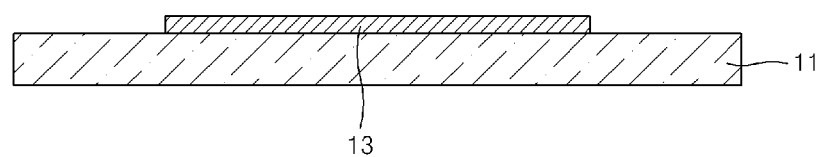
FIG. 2A through 2D sequentially illustrate a method of manufacturing an organic light-emitting display device according to an embodiment of the present disclosure.

FIG. 2A through 2D sequentially illustrate a method of manufacturing an organic light-emitting display device 100 according to an embodiment of the present disclosure. Referring to FIG. 2A, an organic light-emitting portion 13 is formed on a substrate 11. As illustrated in FIG. 1B, the organic light-emitting portion 13 includes a sequentially laminated structure of a first electrode 13a, an organic emission layer 13b, a second electrode 13c on the substrate 11. The first electrode 13a may be formed by using various deposition methods. The first electrode 13a may be patterned to be formed in separate pixels. Thereafter, a pixel defining layer 13d may be formed to cover the first electrode 13a. The pixel defining layer 13d may include a polyacrylate-based or a polyimide-based resin, a silica-based inorganic material, or the like. After forming an opening of a predetermined size on the pixel defining layer 13d, an organic emission layer 13b is formed in a limited region through the opening. Then, the second electrode 13c is formed to cover all of the pixels. A protective layer (not shown) may further be formed on the second electrode 13c.

Figure 2B:
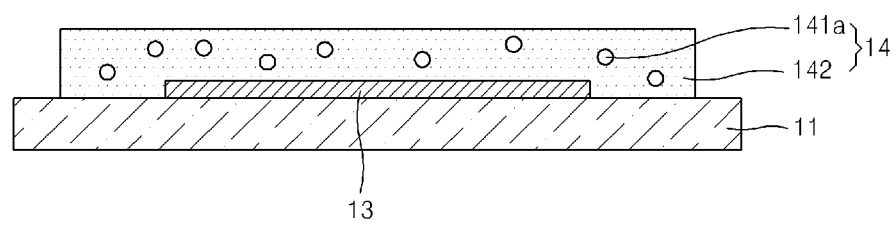

Referring to FIG. 2B, a first inorganic film 14 is formed on the organic light-emitting portion 13. The first organic film 14 may be formed by using resistance heating deposition, sputtering, vacuum deposition, low temperature deposition, electron beam coating, ion plating, or the like. In some embodiments, the first inorganic film 14 may be formed by a plasma chemical vapor deposition (PCVD) or a plasma ion assisted deposition (PIAD). In some embodiments, the first inorganic film 14 may provide a Sn—(P,B)—O—F-based LVT inorganic material on the organic light-emitting portion 13 through sputtering. In greater detail, the sputtering may apply a dual rotary target method, and may use a method in which the substrate 11 moves and scans the inorganic material. The first inorganic film 14 may include pores 141a.

Figure 2C:
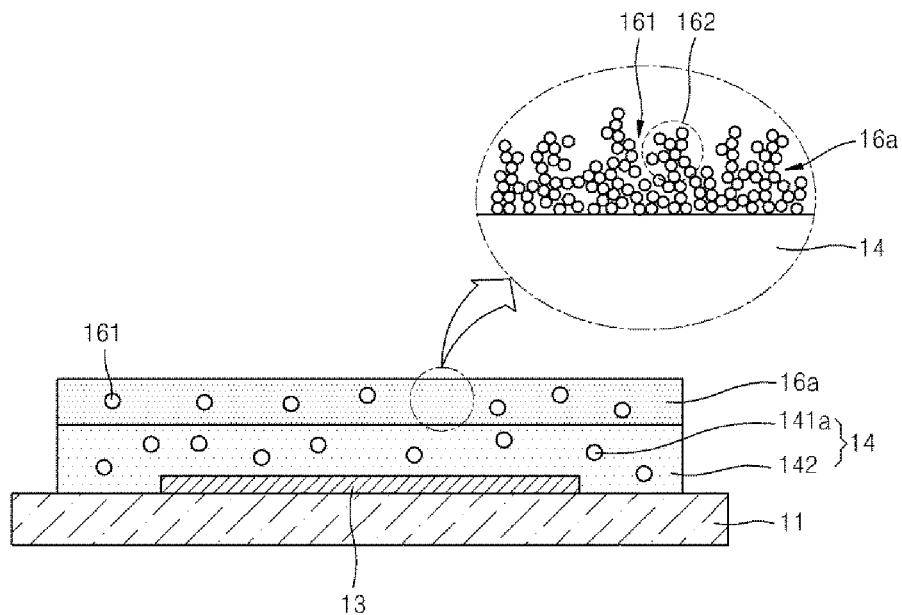

Referring to FIG. 2C, a preliminary second inorganic film 16a is formed on a first inorganic film 14. The preliminary second inorganic film 16a may be formed by using resistance heating deposition, sputtering, vacuum deposition, low temperature deposition, electron beam coating, ion plating, or a combination thereof. In some embodiments, the preliminary second inorganic film 16a may be formed by a plasma chemical vapor deposition (PCVD) or a plasma ion assisted deposition (PIAD). In some embodiments, the preliminary second inorganic film 16a may provide a Sn—P—O—F-based LVT inorganic material on an organic light-emitting portion 13 through sputtering. In greater detail, the sputtering may apply a dual rotary target method, and may use a method in which the substrate 11 moves and scans the inorganic material.

The preliminary second inorganic film 16a may include defects such as deposition components 162 and pinholes 161. A LVT inorganic material deposition component 162 refers to a LVT inorganic material aggregate particle that did not participate in a deposition when the LVT inorganic material was deposited and the pinhole 161 refers to an empty region formed because the LVT inorganic material was not provided thereto. A formation of the LVT inorganic material deposition component 162 may contribute to a formation of the pinhole 161.

The above described defects in the pre-inorganic film 16a may provide a pathway for external environment materials such as moisture and oxygen during maintenance and operation of an organic light-emitting display device, thereby causing formation of a progressive blind spot and a decrease in lifespan of the organic light-emitting display device.

Figure 2D:
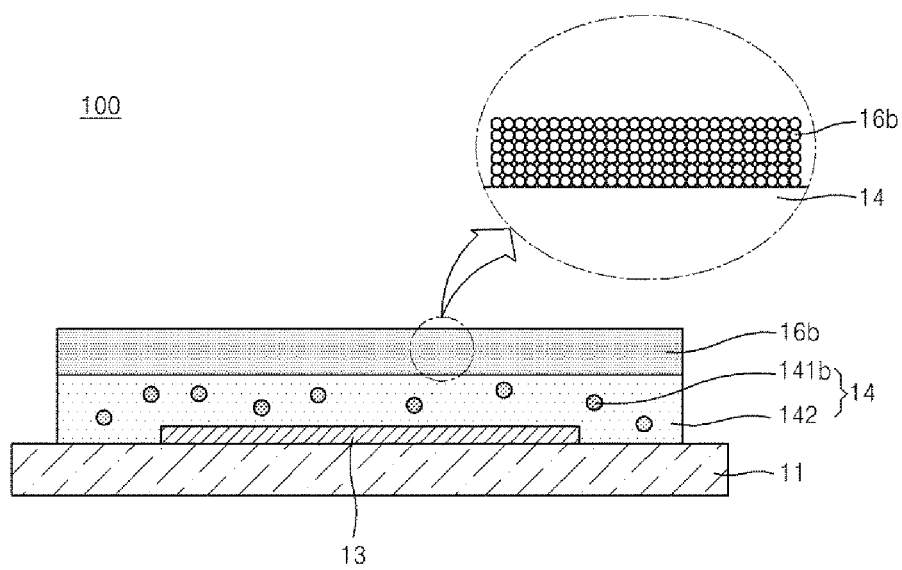

Accordingly, as illustrated in FIG. 2D, after forming the preliminary second inorganic film 16a, an annealing to remove the defects of the preliminary second inorganic film 16a is performed.

The annealing is performed at a temperature greater than or equal to a viscosity transition temperature of the LVT inorganic material included in the preliminary second inorganic film 16a. The annealing may be performed at a temperature at which the organic light-emitting portion 13 does not get damaged. For example, the annealing may be performed by heat treating the preliminary second inorganic film 16a at a temperature range below the transition temperature of a material included in the organic light-emitting portion 13. "The viscosity transition temperature of the LVT inorganic material" may vary according to a composition of the LVT inorganic material and "change in a material included in the organic light-emitting portion 13" may vary according to a material used for the organic light-emitting portion 13; however, the change in the material included in the organic light-emitting portion 13 may be inferred by one of ordinary skill in the art based on the composition of the LVT inorganic materials and the materials used for the organic light-emitting portion 13. For example, the change in the material included in the organic light-emitting portion 13 may be determined by evaluating a glass transition temperature (Tg) of an organic material inferred from TGA analysis results of the materials included in the organic light-emitting portion 13.

In some embodiments, the annealing may be performed by heat treating the preliminary second inorganic film 16a at a temperature of about 80° C. to about 130° C. for one hour to about 3 hours (for example, at a temperature of about 100° C. for 2 hours); but the annealing is not limited thereto. The annealing may be performed for about 1.0, 1.25, 1.5, 1.75, 2.0, 2.25, 2.5, 2.75, or 3.0 hours or any range or time therebetween. The annealing may be performed at a temperature of about 80, 85, 90, 95, 100, 105, 110, 115, 120, 125, 130° C. or any range or temperature therebetween. When the temperature of the annealing satisfies the above described range, the LVT inorganic material of the preliminary second inorganic film 16a becomes fluidized, and a change in the organic light-emitting portion 13 may be prevented.

In some embodiments, the annealing may be processed in an IR oven under a vacuum atmosphere or an inert gas atmosphere (for example, $N_2$ atmosphere or Ar atmosphere)

Due to the annealing, the LVT inorganic material included in the preliminary second inorganic film 16a may be fluidized. A fluidized inorganic material may have flowability. Accordingly, the fluidized LVT inorganic material may flow into a first inorganic film 14 and fill the pores 141a (see FIG. 2B) included in the first inorganic film 14 to form a dispersed inorganic material 141b.

Also, during the annealing, the fluidized LVT inorganic material may flow into and fill pinholes 161 of the preliminary second inorganic film 16a and the deposition components 162 may be fluidized to flow into and fill the pinholes 161. After the heat treatment, the fluidized LVT inorganic material becomes solid again as the temperature drops.

Figure 4:
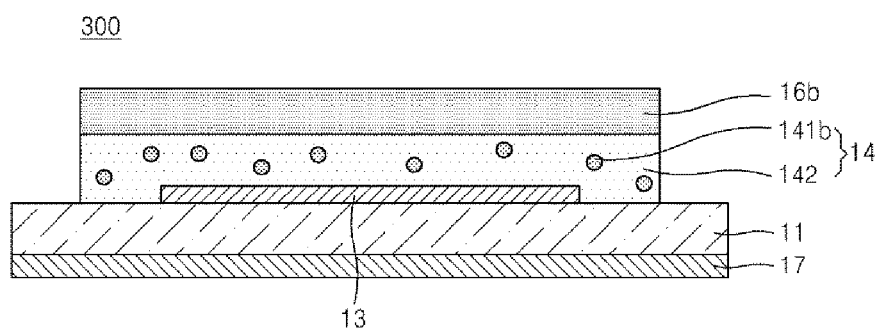
FIG. 4 schematically illustrates a cross-section of an organic light-emitting display device according to another embodiment of the present disclosure.

As shown in FIG. 4, defects of the preliminary second inorganic film 16a may be removed to form a second inorganic film 16b having a dense film quality. Also, the pores 141a of the first inorganic film 14 may be filled with the LVT inorganic materials infiltrated from the preliminary second inorganic film 16a to form the dispersed inorganic material 141b, thereby forming a denser first inorganic film 14.

Figure 3:
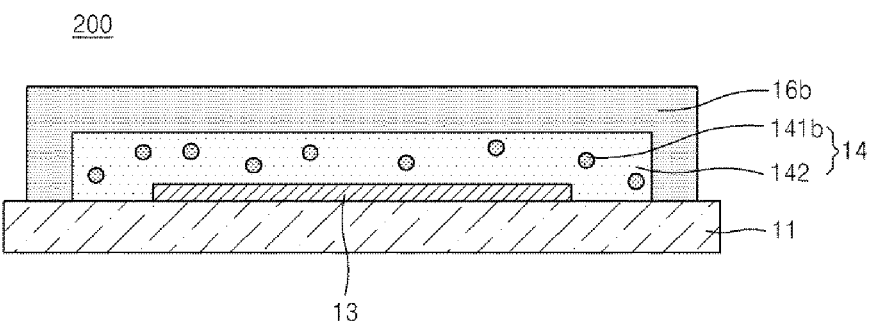
FIG. 3 schematically illustrates a cross-section of an organic light-emitting display device according to another embodiment of the present disclosure.

FIG. 3 schematically illustrates a cross-section of an organic light-emitting display device 200 according to another embodiment of the present disclosure. In FIG. 3, like reference numerals represent like elements of FIG. 1 and repeated descriptions are omitted for simplification of the description. Referring to FIG. 3, the organic light-emitting display device 200 differs from the organic light-emitting display device 100 of FIG. 1 in that the second inorganic film 16b is provided to wrap sides of a first inorganic film 14. The second inorganic film 16b is provided on top and sides of the first inorganic film 14 to strengthen barrier properties on the sides.

FIG. 4 schematically illustrates a cross-section of an organic light-emitting display device 300 according to another embodiment of the present disclosure. In FIG. 4, like reference numerals represents like elements of FIG. 1 and repeated descriptions are omitted for simplification of the description. Referring to FIG. 4, the organic light-emitting display device 300 differs from the organic light-emitting display device 100 of FIG. 1 in that a bottom organic layer 17 is provided on a bottom surface of the substrate 11. The bottom organic layer 17 may strengthen bending properties and/or mechanical strength of the substrate 11. When the substrate 11 is formed of a glass material, the bending property may not be good even when a thin substrate 11 is used. Here, the bottom organic layer 17 may be provided on the bottom surface of the substrate 11 to improve the bending property of the substrate 11. For example, a bending radius of a glass substrate having a thickness of 0.1 mm is about 10 cm; however, when an acryl organic film having a thickness of about 5 μm is coated on the bottom surface of the substrate 11, the substrate 11 does not break even after the substrate 11 has been bent for 10,000 times at a bending radius of about 2 cm.

Figure 5:
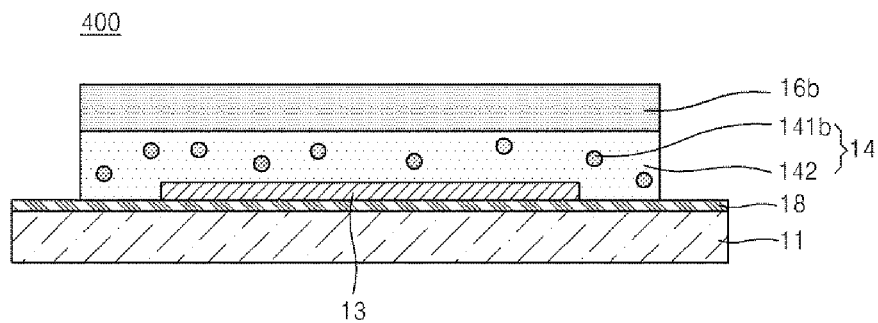
FIG. 5 schematically illustrates a cross-section of an organic light-emitting display device according to another embodiment of the present disclosure.

FIG. 5 schematically illustrates a cross-section of an organic light-emitting display device 400 according to another embodiment of the present disclosure. In FIG. 5, like reference numerals represents like elements of FIG. 1 and repeated descriptions are omitted for simplification of the description. Referring to FIG. 5, the organic light-emitting display device 400 differs from the organic light-emitting display device 100 of FIG. 1 in that a third inorganic film 18 is provided between the substrate 11 and the organic light-emitting portion 13. The third inorganic film 18 may be formed through annealing by using the above-described LVT inorganic material. Although not shown in the drawings, a pixel circuit including a thin film transistor and/or a capacitor may be formed on the third inorganic layer 18. In this case, a sealing property of the organic light-emitting portion 13 may be further improved due to a dense barrier property of the third inorganic layer 18. The third inorganic layer 18 may be useful when a barrier property of the substrate is not good, such as when the substrate is formed of plastic.

Figure 6:
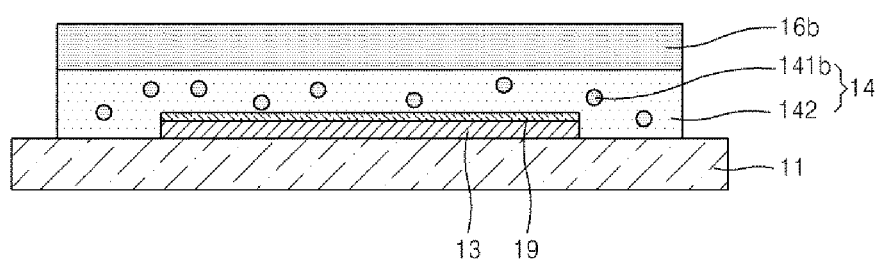
FIG. 6 schematically illustrates a cross-section of an organic light-emitting display device according to another embodiment of the present disclosure.

FIG. 6 schematically illustrates a cross-section of an organic light-emitting display device 500 according to another embodiment of the present disclosure. In FIG. 6, like reference numerals represents like elements of FIG. 1 and repeated descriptions are omitted for simplification of the description. Referring to FIG. 6, the organic light-emitting display device 500 differs from the organic light-emitting display device 100 of FIG. 1 in that a protective layer 19 may be formed on an organic light-emitting portion 13. The protective layer 19 may prevent damage to the second electrode 13c when the first inorganic film 14 and the second inorganic film 16b are formed on the organic light-emitting portion 13. In some embodiments, the protective layer 19 may be formed of a material including at least one of LiF, lithium quinolate, and $Alq_3$.

The organic light-emitting display device may include the first inorganic film, and thus, may prevent film cracks that may occur between the substrate and the second inorganic film and/or between the organic light-emitting portion and the second inorganic film. Also, the organic light-emitting display device provides a thin film sealing layer including an inorganic film that has excellent sealing property with respect to the external environment to achieve an organic light-emitting display device having a long lifespan. Accordingly, the organic light-emitting display device may maintain excellent sealing property. Also, the organic light-emitting display device may have an improved bending property and may not destroy the sealing property even when the organic light-emitting display device is bent.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. An organic light-emitting display device, comprising:
   a substrate;
   an organic light-emitting portion on the substrate;
   a first inorganic film covering the organic light-emitting portion, the first inorganic film comprising a porous inorganic material and dispersed inorganic materials in the pores of the porous inorganic material; and
   a second inorganic film on the first inorganic film and comprising a low temperature viscosity transition inorganic material,
   wherein a coefficient of thermal expansion of the first inorganic film is smaller than a coefficient of thermal expansion of the second inorganic film.

2. The organic light-emitting display device of claim 1, wherein the first inorganic film has a low temperature viscosity transition inorganic material having a higher viscosity transition temperature than the viscosity transition temperature of the low temperature viscosity transition inorganic material comprised in the second inorganic film.

3. The organic light-emitting display device of claim 1, wherein the first inorganic film comprises a low temperature viscosity transition inorganic material and a dispersed inorganic material dispersed in the first inorganic film.

4. The organic light-emitting display device of claim 3, wherein the dispersed inorganic material is the same material as the low temperature viscosity transition inorganic material in the second inorganic film.

5. The organic light-emitting display device of claim 1, wherein the low temperature viscosity transition inorganic material comprises a tin oxide.

6. The organic light-emitting display device of claim 1, wherein the low temperature viscosity transition inorganic material comprises a tin oxide, and wherein the organic light-emitting display device further comprises at least one material selected from a phosphorus oxide, boron phosphate, stannous fluoride, a niobium oxide, and a tungsten oxide.

7. The organic light-emitting display device of claim 1, wherein the low temperature viscosity transition inorganic material comprises SnO, and wherein the organic light-emitting display device further comprises at least one material selected from $P_2O_5$, $BPO_4$, $SnF_2$, NbO, and $WO_3$.

8. The organic light-emitting display device of claim 1, wherein a viscosity transition temperature of the low temperature viscosity transition inorganic material comprised in the second inorganic film is lower than a transition temperature of the organic light-emitting portion.

9. The organic light-emitting display device of claim 1, wherein the first inorganic film comprises a Sn—(P,B)—O—F-based low temperature viscosity transition inorganic material, and wherein the second inorganic film comprises a Sn—P—O—F-based low temperature viscosity transition inorganic material.

10. The organic light-emitting display device of claim 9, wherein the first inorganic film is the Sn—(P,B)—O—F-based low temperature viscosity transition inorganic material, and wherein a ratio of phosphorus (P) to boron (B) of the first inorganic film is about 9:1 to about 7:3.

11. The organic light-emitting display device of claim 1, wherein a coefficient of thermal expansion of the first inorganic film is greater than or equal to the coefficient of thermal expansion of the substrate.

12. The organic light-emitting display device of claim 1, wherein the second inorganic film wraps around the top and sides of the first inorganic film.

13. The organic light-emitting display device of claim 1, further comprising a bottom organic layer on a bottom surface of the substrate.

14. The organic light-emitting display device of claim 1, further comprising a third inorganic film between the substrate and the organic light-emitting portion.

15. The organic light-emitting display device of claim 1, further comprising a protective layer on the organic light-emitting portion.

16. An organic light-emitting display device, comprising:
   a substrate;
   an organic light-emitting portion on the substrate;
   a first inorganic film covering the organic light-emitting portion and comprising a first low temperature viscosity transition inorganic material, the first inorganic film comprising a porous inorganic material;
   a second inorganic film formed on the first inorganic film and comprising a second low viscosity transition inorganic material; and
   a dispersed inorganic material dispersed in the pores of the first inorganic film and comprising the second low viscosity transition inorganic material, wherein a viscosity transition temperature of the second low viscosity transition inorganic material is lower than the viscosity transition temperature of the first low viscosity transition inorganic material.

17. The organic light-emitting display device of claim 16, wherein a coefficient of thermal expansion of the first inorganic film is greater than the coefficient of thermal expansion of the substrate and smaller than the coefficient of thermal expansion of the second inorganic film.

18. The light-emitting display device of claim 16, wherein the first low viscosity transition inorganic material is a Sn—(P,B)—O—F-based low viscosity transition inorganic material in which a ratio of phosphorus to boron is about 9:1 to about 7:3, and wherein the second inorganic film comprises a Sn—P—O—F-based low viscosity transition inorganic material.

19. The light-emitting display device of claim 16, wherein a viscosity transition temperature of the second low viscosity transition inorganic material is lower than the transition temperature of the organic light-emitting portion.

* * * * *